United States Patent
Huang

(10) Patent No.: US 6,177,364 B1
(45) Date of Patent: *Jan. 23, 2001

(54) INTEGRATION OF LOW-K SIOF FOR DAMASCENE STRUCTURE

(75) Inventor: Richard J. Huang, Cupertino, CA (US)

(73) Assignee: Advanced Micro Devices, Inc., Sunnyvale, CA (US)

(*) Notice: Under 35 U.S.C. 154(b), the term of this patent shall be extended for 0 days.

This patent is subject to a terminal disclaimer.

(21) Appl. No.: 09/203,754

(22) Filed: Dec. 2, 1998

(51) Int. Cl.[7] .......................... H01L 21/31; H01L 21/4763
(52) U.S. Cl. .......................... 438/792; 438/634; 438/637; 438/774; 438/776
(58) Field of Search .......................... 438/792, 774, 438/776, 618, 622–629, 634, 637–640, 666–668, 672–675, 687–688

(56) References Cited

U.S. PATENT DOCUMENTS

| 5,920,790 | * | 7/1999 | Wetzel et al. | 438/618 |
| 5,989,998 | * | 11/1999 | Sugahara et al. | 438/623 |
| 5,994,778 | * | 11/1999 | Huang et al. | 257/758 |

* cited by examiner

Primary Examiner—Charles Bowers
Assistant Examiner—Thanh Nguyen
(74) Attorney, Agent, or Firm—Foley & Lardner

(57) ABSTRACT

An interlayer dielectric for a damascene structure includes a first etch stop layer formed on a substrate. A first interlayer dielectric layer containing fluorine is formed on the first etch stop layer by deposition. A second etch stop layer is formed on the first interlayer dielectric layer. A second interlayer dielectric layer containing fluorine is formed on the second etch stop layer by deposition. The first and second interlayer dielectric layers and the first and second etch stop layers are etched to form at least one trench and at least one via. The at least one trench and the at least one via are treated with an $H_2/N_2$ plasma in-situ, wherein a fluorine-depleted region in the first and second interlayer dielectric layers is formed, and wherein a nitrided region is formed adjacent the fluorine-depleted region, with the nitrided region corresponding to a side surface of the at least one trench and the at least one via. A barrier metal layer is deposited in the at least one trench and the at least one via, whereby the nitrided region provides a passivation layer by which fluorine in the fluorine-depleted region is kept from leeching into the barrier metal layer. The at least one trench and the at least one via are then filled with either copper or aluminum.

15 Claims, 3 Drawing Sheets

INTEGRATION OF LOW-K SIOF FOR DAMASCENE STRUCTURE

BACKGROUND OF THE INVENTION

1. Field of the Invention

The present invention relates to the integration of low-K SiOF as an inter-layer dielectric (ILD) for a damascene structure. In particular, the present invention relates to integrating fluorosilicate glass (FSG) or SiOF as an inter-layer dielectric for a damascene structure, to thereby obtain the benefit of a low dielectric constant (low-k) to improve device performance.

2. Description of the Related Art

Fluorinated $SiO_2$, typically provided by way of plasma enhanced chemical vapor deposition (PECVD) or by way of high density plasma (HDP), can be used to lower the dielectric constant of $Sio_2$ from, for example, 4.0 to 3.5–3.8. The lowering of the dielectric constant is advantageous for a number of reasons, including the reduction of the capacitance of a semiconductor device, which results in an improved performance of the semiconductor device.

However, fluorine in $SiO_2$ will react with physical vapor deposition (PVD) barrier metals, such as Ti, TiN, Ta, TaN, etc., which are subsequently deposited on the surface of the fluorinated $SiO_2$. This reaction between fluorine and the barrier metals will cause delamination on flat SiOF surfaces, as well as inside via holes. Both of these occurrences are disadvantageous.

SUMMARY OF THE INVENTION

It is an object of the present invention to provide fluorosilicate glass (FSG) as an intermetal dielectric for a damascene structure, whereby the possibility of fluorine leakage to neighboring layers is lessened.

It is another object of the present invention to provide FSG as an inter-metal dielectric layer for a damascene structure using in-situ deposition.

The above-mentioned objects and other advantages of the present invention may be achieved by a method of forming an interlayer dielectric on a substrate. The method includes a step of forming a first etch stop layer on the substrate. The method also includes a step of forming a first interlayer dielectric layer on the first etch stop layer by deposition using one of a plasma-enhanced chemical vapor deposition and a high deposition pressure chemical vapor deposition, where the first interlayer dielectric layer contains fluorine. The method further includes a step of forming a second etch stop layer on the first interlayer dielectric layer. The method still further includes a step of forming a second interlayer dielectric layer on the second etch stop layer by deposition using one of a plasma-enhanced chemical vapor deposition and a high deposition pressure chemical vapor deposition, where the second interlayer dielectric layer contains fluorine. The method also includes a step of etching the first and second interlayer dielectric layers and the first and second etch stop layers to form at least one trench and at least one via. The method further includes a step of treating the at least one trench and the at least one via with an $H_2/N_2$ plasma in-situ, wherein a fluorine-depleted region in the first and second interlayer dielectric layers is formed, and wherein a nitrided region is formed adjacent the fluorine-depleted region, with the nitrided region corresponding to a side surface of the at least one trench and the at least one via. The method still further includes a step of depositing a barrier metal layer in the at least one trench and the at least one via, whereby the nitrided region provides a passivation layer by which fluorine in the fluorine-depleted region is kept from leeching into the barrier metal layer. The step also includes a step of filling the at least one trench and the at least one via with one of copper and aluminum.

The above-mentioned objects and other advantages may also be achieved by a semiconductor device having a damascene structure and being formed on a substrate. The semiconductor devices includes a first etch stop layer formed on the substrate. The device also includes a first fluorosilicate glass layer formed on the first etch stop layer, the first fluosilicate glass layer including at least one via. The device further includes a second etch stop layer formed on the first fluosilicate glass layer. The device still further includes a second fluorosilicate glass layer formed on the second etch stop layer, the second fluosilicate glass layer including at least one via that provides a conductive path to the substrate and to the at least one trench. Sidewalls of the at least one trench and the at least one via include a barrier metal layer that forms an outer surface of the sidewalls, a nitrided region formed adjacent to the barrier metal layer, and a nitrided region formed adjacent to the nitrided region, with the nitrided region being disposed between the fluorine-depleted region and the barrier metal layer to thereby provide a barrier for preventing fluorine atoms in the fluorine-depleted region from moving into the barrier metal layer.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENTS

The present invention will be described in detail below, with references to the accompanying figures. The present invention is described in the context of use with an inter-layer dielectric for a damascene structure on a semiconductor chip. However, the present invention has broad application to other structures or devices where a dielectric layer containing fluorine is used as an interlayer dielectric (e.g., inter-metal dielectric) in a damascene structure.

Figure 1A:
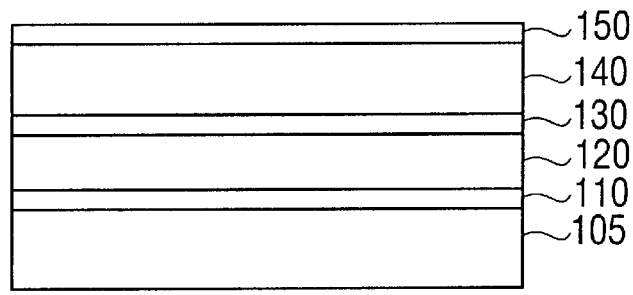
FIGS. 1A–1E show steps involved in the formation of an intermetal dielectric layer for a damascene structure according to a preferred embodiment of the invention.

FIGS. 1A–1E illustratively show the steps involved in creating a low-K SiOF (or fluorosilicate glass) as an inter-metal dielectric for a damascene structure formed on a substrate (e.g., silicon substrate). FIG. 1A shows a first etch stop layer 110, which has been deposited onto a semiconductor substrate 105. The etch stop layer 110 is preferably either SiN (silicon nitride) or SiC (silicon carbide), with SiN having a dielectric constant of approximately 8, and with SiC having a dielectric constant of approximately 5. FIG. 1A shows a first fluorosilicate glass (FSG) layer 120 that has been deposited onto the first etch stop layer 110. The first FSG layer 120 is preferably deposited by either a plasma-enhanced chemical vapor deposition (PECVD) or by a high density plasma chemical vapor deposition (HDP-CVD). A second etch stop layer 130 is then deposited onto the first FSG layer 120. The second etch stop layer 130 is preferably either SiN or Sic.

A second FSG layer 140 is deposited onto the second etch stop layer 130. The second FSG layer 140 is preferably deposited by either a PECVD or by a HDP-CVD. A third etch stop layer 150 is then deposited onto the second FSG layer 140. The third etch stop layer is preferably either SiN or SiC. Typical thicknesses for the first and second FSG layers 120, 140 are between 8000 angstroms to 1 micron for each layer. Typical thicknesses for the first through third etch stop layers 110, 130, and 150 are between 500 angstroms and 2000 angstroms for each layer. Of course, other thicknesses are possible while remaining within the scope of the invention.

Figure 1B:
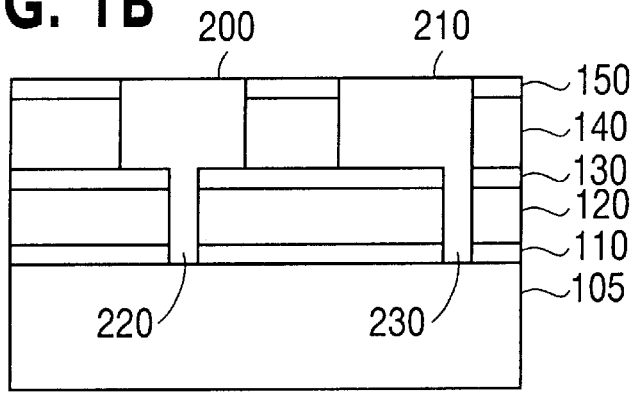

FIG. 1B shows the semiconductor structure after trenches 200, 210 and vias 220, 230 have been formed. The formation of trenches and vias to create a damascene structure is well known to those skilled in the art, and will not be described in detail in order to provide a clear and concise description of the present invention. With the structure as shown in FIG. 1B, an $H_2/N_2$ plasma treatment is performed, as, for example, in a manner as described in related co-pending U.S. patent application Ser. No. 09/157,240, filed Sep. 18, 1998, which is incorporated in its entirety herein by reference. As explained in detail in the related co-pending application, the plasma treatment involves treating a surface of the FSG layers 120, 140 with a plasma containing hydrogen. For example, the plasma may be pure hydrogen, or it may be diluted $H_2$ plasma, such as, for example, $H_2/N_2$ plasma. The purpose of the hydrogen plasma is to make the hydrogen less volatile. That is, the activation energy of the hydrogen is too high to bond with the fluorine atoms if it is not in a plasma form.

The hydrogen in the plasma will bond with the fluorine atoms in the outer portions of the FSG layers 120, 140 in the sidewalls of the trenches 200, 210 and the vias 220, 230. The hydrogen in the plasma will bond to the fluorine atoms to form HF, which will vaporize and be evacuated, thereby forming a fluorine-depleted region in each of the FSG layers 120, 140. In the preferred embodiment, the hydrogen treatment is performed in a CVD chamber (in-situ), such as, for example, an Applied Materials' CVD chamber. The CVD chamber may be the same chamber used to deposit a subsequent barrier metal layer, such as Ti, TiN, Ta, or TaN, as will be discussed below.

Preferably, the CVD chamber for the hydrogen plasma treatment should have a slightly elevated temperature (5–50° C. higher) relative to the temperature used to deposit the subsequent barrier metal layer. For example, if a temperature falling in the range of 375° C. to 450° C. is to be used to deposit a subsequent barrier metal layer, then a slightly elevated temperature that is 5–50° C. higher than a barrier metal layer CVD temperature is used during the plasma treatment step. The barrier metal layer is deposited in a step that occurs after the step of treating of the FSG layers with a hydrogen plasma. The purpose of this elevated temperature is to lower the probability that heating during a subsequent barrier metal deposition step will drive the fluorine atoms from the FSG layers 120, 140 and into the barrier metal layers.

The other parameters for the hydrogen plasma treatment step will be determined empirically. Typically, the pressure in the CVD chamber will be in the millitorr to torr range, the energy parameter will be in the several hundred watt range, and plasma treatment time will range from 20 seconds to several minutes. Optimized parameters will be determined based on the desired thickness of the fluorine-depleted region.

Figure 1C:
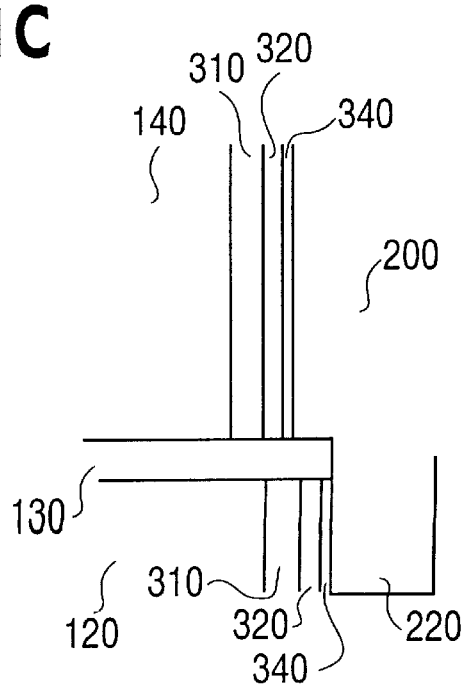

After the hydrogen plasma treatment, a nitrogen plasma treatment is performed to create a nitrided region adjacent to the fluorine-depleted region. The nitrided region corresponds to a passivation layer, and may be an SiON layer, for example. In the present invention, the passivation layer is formed by providing a nitrogen-rich plasma to the trenches and vias, to thereby form the passivation layer. FIG. 1C is a blow-up of a sidewall of the trench 200, where the fluorine-depleted region 310 and the nitrided region 320 are shown, as well as a barrier metal layer 340 that is subsequently provided for the sidewalls of the trenches 200, 210 and vias 220, 230. The sidewall structure of the trench 200 as shown in FIG. 1C is the same as the sidewall structure for the other trenches and vias.

The step of forming the fluorine-depleted region 310 may be done by way of a first step of providing an $H_2/N_2$ plasma, which has a heavy concentration of $H_2$, in a CVD chamber to thereby cause the fluorine in the FSG layers 120, 140 to react with the $H_2$ and vaporize to result in a fluorine-depleted region 310. Then, the step of forming the nitrided region 320 may be done by way of a second step of providing an $H_2/N_2$ plasma, which has a heavy concentration of $N_2$ (relative to that provided in the first step), deposited at a higher power than the first step in order to ensure that enough energy is present for the nitrogen in the $H_2/N_2$ plasma to bond with the fluorine-depleted region 310.

That is, the passivation layer 320 acts as a barrier with respect to the non-volatile atoms in the fluorine-depleted region, to thereby lessen the probability of fluorine atoms from the FSG layer 120, 140 and their corresponding fluorine-depleted regions 310 diffusing up into the barrier metal layer 340 that will be subsequently formed on the sidewalls of the trenches 200, 210 and vias 220, 230. That is, the nitrogen-rich plasma causes a nitriding of the oxide in the FSG layers 120, 140 to thereby obtain a silicon oxynitride region, which corresponds to the passivation layer 320.

If the fluorine atoms were to be allowed to diffuse up into the barrier metal layer 340, this would cause impurities in that layer, which would lessen the effectiveness of that layer in keeping the copper or aluminum that would be subsequently deposited into the trenches and vias from interacting with neighboring regions. This interacting of fluorine atoms with a barrier metal layer is undesirable, and lessens the barrier strength of the barrier metal layer.

The passivation step may alternatively be carried out by switching to a pure $N_2$ plasma in a CVD chamber to form SiON to a thickness that is less than the thickness of the fluorine-depleted region 310. In this alternative process, a first step of providing a pure $H_2$ plasma is utilized to form the fluorine-depleted region 310, and then a second step of providing a pure $N_2$ plasma is utilized to form the nitrided passivation layer 320. As explained above, the passivation layer 320 lessens the probability that fluorine atoms will diffuse out from the fluorine-depleted region 310, and thereafter react, for example, with a Ti or TiN barrier metal layer 340 deposited thereabove.

In the plasma treatment steps discussed above, the sidewalls of the trenches 200, 210 and the vias 220, 230 are treated with the plasma, in order to form the fluorine-depleted regions 310 and nitrided regions 320 on the sidewalls of the trenches and vias. Since vias that are created for state-of-the-art (e.g., sub-micron) semiconductor devices have a high aspect ratio, the present invention provides for a low pressure, high bias condition during the CVD in-situ plasma treatments in order for the plasma to be provided to the sidewalls of the vias. For the trenches, a high pressure, low bias condition in-situ CVD plasma treatment may be utilized to cover the sidewalls of the trenches with the $H_2/N_2$ plasma, due to the larger sizes of the trenches relative to the vias. For example, a bias power of less than 100 watts may be utilized for treating the sidewalls of the trenches. One purpose of the low bias power is to make the plasma less directional so that it will affect the sidewalls of the trenches.

In the present invention, the fluorine-depleted region 310 is about 100 angstroms in thickness, and the nitrided region that forms the passivation layer 320 is about 50 angstroms in thickness. Of course, other sizes may be contemplated while remaining within the scope of the invention as described herein. The exact thickness of the passivation layer 320 may be optimized empirically. A SIMS analysis may be performed to measure the thickness of the fluorine-depleted region and the thickness of the passivation layer. Ultimately, optimization is achieved when the thickness of the fluorine-depleted layer 310 and the passivation layer 320 are such that it can be assumed that any subsequent layer applied thereto will not peel off and will not receive much if any fluorine atoms from these regions. In the present invention, a CVD chamber is utilized in the plasma treatment steps, but other types of plasma chambers may be utilized while remaining within the scope of the invention.

Figure 1D:
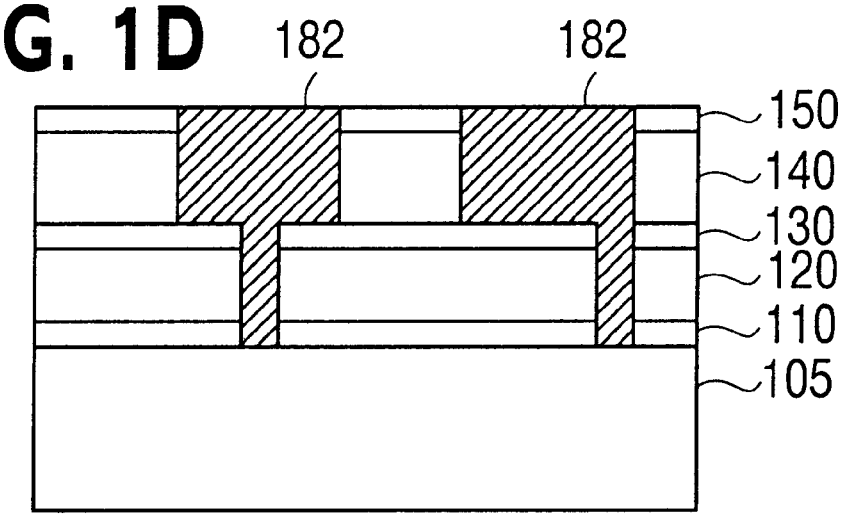

FIG. 1D shows the semiconductor device after the trenches and vias have been coated with a barrier metal layer (not shown, but see layer 340 in FIG. 1C), and then filled with a conductor, for example, copper or aluminum 182 (hatched area in FIG. 1D). The barrier metal deposition (BMD) uses either tantalum (Ta) or tantalum nitride (TaN) for copper fill, or titanium (Ti) or titanium nitride (TiN) for aluminum fill. Physical vapor deposition (PVD, or sputtering) is the preferably method of deposition for Ta or TaN, but in the future CVD may be utilized. For Ti or TiN, the preferably method of deposition is in a CVD chamber. Also, PVD may be utilized instead of CVD for Ti or TiN deposition.

Once the barrier metal layer is deposited, the barrier-metal-coated trenches and vias are filled with a conductor, such as, for example, copper (Cu) or aluminum (Al). A copper-fill step may be performed by either PVD, CVD or electro-plating, while an aluminum-fill step may be performed by either PVD or CVD.

Figure 1E:
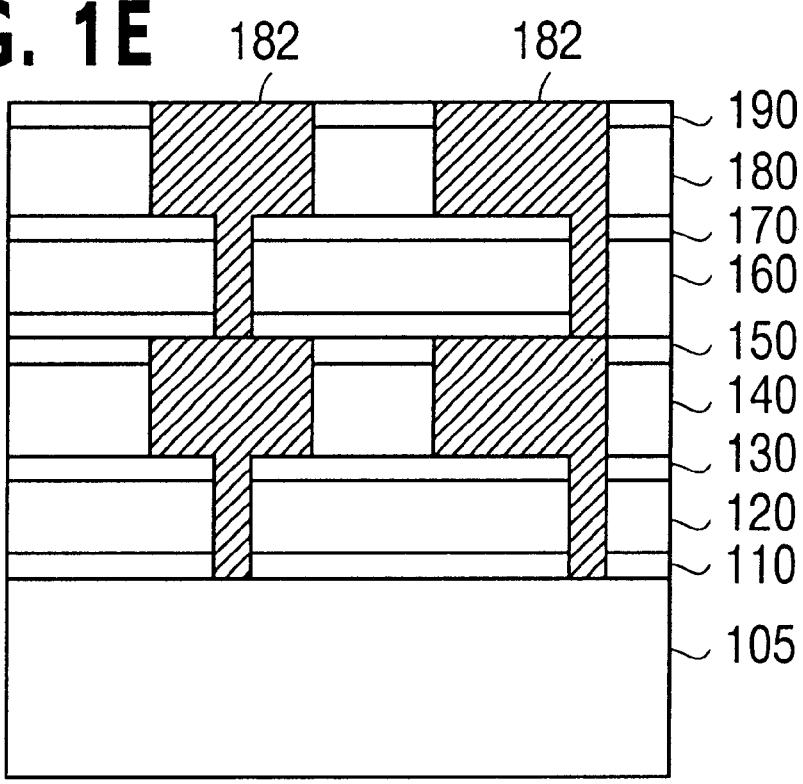

FIG. 1E shows a semiconductor device having multiple layers, in which the processes as shown in FIGS. 1A–1D are repeated to form the top two layers above the already-formed bottom two layers. As a result, a four-stack semiconductor device 410 of FIG. 1E is obtained, which includes first through fourth FSG layers 120, 140, 160, 180, and first through fifth etch stop layers 110, 130, 150, 170, 190. This process described above can be repeated to form a multi-stack damascene structure having any desired number of layers or stacks (e.g., odd or even number), in accordance with the teachings of the present invention.

As a final step, an oxide cap (not shown) may be applied to the top layer of the multi-layer stack, in a manner known to those skilled in the art. For example, an oxide cap may be used such as the one described in a related co-pending U.S. patent application Ser. No. 09/203,572, entitled "Integration of Low-K SiOF as Inter-Layer Dielectric", which is incorporated in its entirety herein by reference. Also, the top layer of FIG. 1E may be planarized in a well-known manner, and a conducting layer may be provided thereabove. Furthermore, the top FSG layer of FIG. 1E may have its top surface treated with an $H_2/N_2$ plasma prior to (or in place of) an oxide cap formation, in a manner described in co-pending U.S. patent application Ser. No. 09/157,240, discussed above. That way, there is a lessened possibility for fluorine atoms in the top FSG layer from leeching into any conducting layer that is located adjacent to the top FSG layer.

Figure 2:
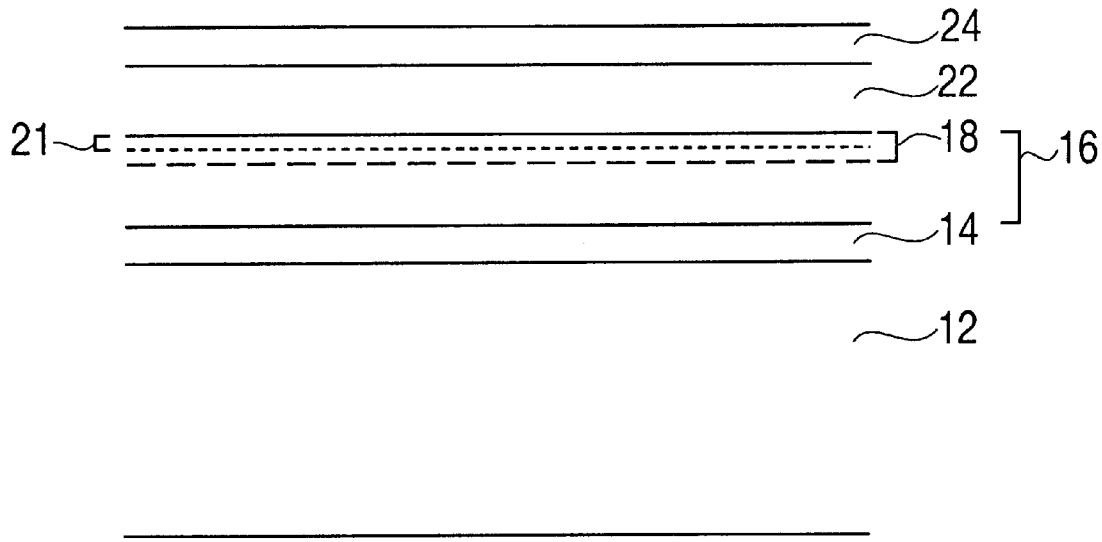
FIG. 2 shows a structure having a fluorine-depleted region and a nitrided region that is formed in the intermetal dielectric layer according to the invention.
Figure 3:
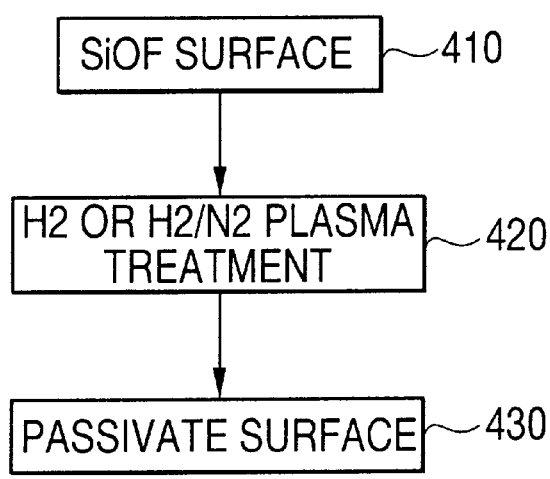
FIG. 3 shows the steps involved in creating a fluorine-depleted region and a nitrided region on a fluorine-based intermetal dielectric layer according to the invention.

FIG. 2 shows a structure having a bulk substrate 12, a first conducting layer 14 formed on the substrate 12, a SiOF layer 16 that is formed on the first conducting layer 14 and that includes a depleted layer 18 and an SiON passivation layer 21, a second conducting layer 22 formed on the passivation layer 21, and a tungsten-deposition layer 24 formed on the conducting layer 22. FIG. 2 is taken from the related co-pending U.S. patent application Ser. No. 09/157,240, discussed above. FIG. 3 is also taken from the related co-pending U.S. patent application Ser. No. 09/157,240, and shows the three steps involved in creating a fluorine-depleted region. In a first step 410, an SiOF layer or other type of fluorine-based layer is deposited. Then, in a step 420, either $H_2$ or $H_2/N_2$ plasma treatment is performed, to thereby create a fluorine-depleted region 18 in the SiOF layer. Next, in a step 430, the surface of the fluorine-depleted region 18 is passivated, by, for example, a nitrogen-rich plasma to thereby form a passivation layer 20. The passivation layer 20 provides additional protection in keeping fluorine atoms in the SiOF layer from moving into a conducting layer formed above the SiOF layer.

While the present invention is particularly advantageous when used to form an SiOF (or FSG) inter-metal dielectric layer for a damascene structure, it has application in any situation where the fluorine atoms in an intermetal dielectric are causing interaction and/or adhesion problems with other neighboring layers.

While a preferred embodiment has been described herein, modification of the described embodiment may become apparent to those of ordinary skill in the art, following the teachings of the invention, without departing from the spirit and scope of the invention as set forth in the appended claims. For example, while FIGS. 1A–1E show trenches that have an etch stop layer at the bottom of each trench, that etch stop layer can be etched away, leaving a top surface of an FSG layer as a bottom surface of each trench. Depending upon the circumstances, it may or may not be better to keep the etch stop layer at the bottom of each trench. Furthermore, although the present invention has been described with reference to the sidewalls of trenches and vias, the topmost FSG layer may be treated in a manner described in the related co-pending applications, and then planarized, so as to provide a fluorine barrier to any conducting layers provided thereabove.

Still further, while the present invention has been described with reference to a dual damascene structure, the teachings of the present invention are equally application to a single damascene structure.

Moreover, in relation to the claims, a substrate for the dielectric layer may generally be defined as any layer or material that lies underneath and supports the dielectric layer.

What is claimed is:

1. A method of forming an interlayer dielectric formed on a substrate, comprising:

forming an interlayer dielectric layer on the substrate, wherein the interlayer dielectric layer contains fluorine;

forming at least one opening in the interlayer dielectric layer to provide a conductive path to the substrate;

forming a fluorine-depleted region in the interlayer dielectric layer at least in a region adjacent to the at least one opening; and forming a nitrided region adjacent to the fluorine-depleted region, wherein the interlayer dielectric is formed for a damascene structure.

2. A method of forming an interlayer dielectric formed on a substrate, comprising:

forming a first etch stop layer on the substrate;

forming a first interlayer dielectric layer on the first etch stop layer, wherein the first interlayer dielectric layer contains fluorine;

forming a second etch stop layer on the first interlayer dielectric layer;

forming a second interlayer dielectric layer on the second etch stop layer, wherein the second interlayer dielectric layer contains fluorine;

etching the first and second interlayer dielectric layers and the first and second etch stop layers to form at least one trench and at least one via; and treating the at least one trench and the at least one via with a plasma containing hydrogen and nitrogen, wherein a fluorine-depleted region in the first and second interlayer dielectric layers is formed, and wherein a nitrided region is formed adjacent the fluorine-depleted region, with the nitrided region corresponding to a side surface of the at least one trench and the at least one via.

3. The method according to claim 2, wherein the first interlayer dielectric layer is formed by deposition using one of a plasma-enhanced chemical vapor deposition and a high deposition pressure chemical vapor deposition.

4. The method according to claim 2, wherein the treating step is performed in-situ in a chemical vapor deposition chamber.

5. The method according to claim 4, wherein the treating step is performed with an $H_2/N_2$ plasma.

6. The method according to claim 4, wherein the treating step comprises:

providing an $H_2$ plasma in-situ to thereby form the fluorine-depleted region; and thereafter providing an $N_2$ plasma in-situ to thereby form the nitrided region.

7. The method according to claim 5, wherein the treating step comprises:

providing the $H_2/N_2$ plasma with a higher concentration of hydrogen;

thereafter providing the $H_2/N_2$ plasma with a higher concentration of nitrogen.

8. The method according to claim 2, further comprising:

depositing a barrier metal layer in the at least one trench and the at least one via, wherein the nitrided region provides a passivation layer by which fluorine in the fluorine-depleted region is kept from leeching into the barrier metal layer.

9. The method according to claim 6, further comprising:

depositing a barrier metal layer in the at least one trench and the at least one via, wherein the nitrided region provides a passivation layer by which fluorine in the fluorine-depleted region is kept from leeching into the barrier metal layer.

10. The method according to claim 7, further comprising:

depositing a barrier metal layer in the at least one trench and the at least one via, wherein the nitrided region provides a passivation layer by which fluorine in the fluorine-depleted region is kept from leeching into the barrier metal layer.

11. The method according to claim 8, further comprising:

filling the at least one trench and the at least one via with one of copper and aluminum.

12. The method according to claim 9, further comprising:

filling the at least one trench and the at least one via with one of copper and aluminum.

13. The method according to claim 10, further comprising:

filling the at least one trench and the at least one via with one of copper and aluminum.

14. The method according to claim 11, wherein the filling step is performed by one of physical vapor deposition and chemical vapor deposition.

15. The method according to claim 8, wherein the barrier metal layer is one of titanium, titanium nitride, tantalum, and tantalum nitride.

* * * * *